(12) United States Patent
Nishimura

(10) Patent No.: US 12,014,840 B2
(45) Date of Patent: *Jun. 18, 2024

(54) METHOD FOR MANUFACTURING ANISOTROPIC CONDUCTIVE FILM, AND ANISOTROPIC CONDUCTIVE FILM

(71) Applicant: DEXERIALS CORPORATION, Tokyo (JP)

(72) Inventor: Junichi Nishimura, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 132 days.

This patent is subject to a terminal disclaimer.

(21) Appl. No.: 17/315,862

(22) Filed: May 10, 2021

(65) Prior Publication Data

US 2021/0265076 A1   Aug. 26, 2021

Related U.S. Application Data

(63) Continuation of application No. 16/087,526, filed as application No. PCT/JP2017/016255 on Apr. 25, 2017, now Pat. No. 11,004,574.

(30) Foreign Application Priority Data

May 2, 2016  (JP) ................. 2016-092832
May 2, 2016  (JP) ................. 2017-085492

(51) Int. Cl.
| | |
|---|---|
| H01B 1/20 | (2006.01) |
| H01B 1/22 | (2006.01) |
| H01B 5/16 | (2006.01) |
| H01B 13/34 | (2006.01) |
| H01L 23/00 | (2006.01) |
| H01R 4/04 | (2006.01) |
| H01R 11/01 | (2006.01) |
| H01R 43/00 | (2006.01) |
| H05K 3/32 | (2006.01) |

(52) U.S. Cl.
CPC ............. *H01B 1/22* (2013.01); *H01B 5/16* (2013.01); *H01B 13/34* (2013.01); *H01L 24/83* (2013.01); *H01R 4/04* (2013.01); *H01R 11/01* (2013.01); *H01R 43/00* (2013.01)

(58) Field of Classification Search
CPC .. H01B 1/22; H01B 5/16; H01B 13/34; H01L 24/83; H01L 24/27; H01L 24/29; H01L 24/32; H01R 4/04; H01R 11/01; H01R 43/00

See application file for complete search history.

(56) References Cited

U.S. PATENT DOCUMENTS

| | | | |
|---|---|---|---|
| 10,272,598 B2 | 4/2019 | Shinohara et al. | |
| 2015/0231803 A1 | 8/2015 | Shinohara et al. | |
| 2015/0319867 A1 | 11/2015 | Sato | |
| 2016/0155717 A1 | 6/2016 | Saruyama et al. | |
| 2019/0224889 A1 | 7/2019 | Shinohara et al. | |
| 2021/0371706 A1 | 12/2021 | Shinohara et al. | |

FOREIGN PATENT DOCUMENTS

| | | |
|---|---|---|
| CN | 104541416 A | 4/2015 |
| JP | H07-247467 A | 9/1995 |
| JP | 2007-232627 A | 9/2007 |
| JP | 2007-297636 A | 11/2007 |
| JP | 2008-300360 A | 12/2008 |
| JP | 2010-033793 A | 2/2010 |
| JP | 2010-176910 A | 8/2010 |
| JP | 2013-037944 A | 2/2013 |
| JP | 2013-055045 A | 3/2013 |
| JP | 2013-258136 A | 12/2013 |
| JP | 2014-60025 A | 4/2014 |
| JP | 2014-060151 A | 4/2014 |
| JP | 2015-135748 A | 7/2015 |
| KR | 10-2006-0066210 A | 6/2006 |
| TW | 201422762 A | 6/2014 |
| WO | 2013/005831 A1 | 1/2013 |
| WO | 2014/030753 A1 | 2/2014 |
| WO | 2014/034741 A1 | 3/2014 |
| WO | 2015/016207 A1 | 2/2015 |

OTHER PUBLICATIONS

Aug. 1, 2017 International Search Report issued in International Patent Application No. PCT/JP2017/016255.
Jun. 4, 2019 Office Action issued in Chinese Patent Application No. 201780020535.7.
Oct. 30, 2019 Notification of Reason for Refusal issued in Korean Patent Application No. 10-2018-7029867.
Mar. 26, 2020 Office Action issued in Chinese Patent Application No. 201780020535.7.
May 22, 2020 Office Action issued in Korean Patent Application No. 10-2018-7029867.
Nov. 9, 2020 Office Action in Taiwanese Patent Application No. 106114397.

(Continued)

Primary Examiner — Haidung D Nguyen
(74) Attorney, Agent, or Firm — Oliff PLC

(57) ABSTRACT

Provided is an anisotropic conductive film manufacturing method capable of reducing manufacturing costs. Also provided is an anisotropic conductive film capable of suppressing the occurrence of conduction defects. The anisotropic conductive film manufacturing method includes: a holding step of supplying conductive particles having a plurality of particle diameters on a member having a plurality of opening parts, and holding the conductive particles in the opening parts; and a transfer step of transferring the conductive particles held in the opening parts to an adhesive film. In the particle diameter distribution graph (X-axis: particle diameter (μm), Y-axis: number of particles) of the conductive particles held in the opening parts, the shape of the graph is such that the slope is substantially infinite in a range at or above a maximum peak particle diameter.

17 Claims, 7 Drawing Sheets

(56) References Cited

OTHER PUBLICATIONS

Nov. 4, 2021 Office Action issued in Chinese Application No. 110129669.
Aug. 8, 2022 Office Action issued in Japanese Application No. 2021-085711.
Aug. 4, 2021 Office Action issued in Korean Application No. 10-2021-7012297.
Jan. 27, 2022 Office Action in Taiwanese Patent Application No. 110129669.

METHOD FOR MANUFACTURING ANISOTROPIC CONDUCTIVE FILM, AND ANISOTROPIC CONDUCTIVE FILM

CROSS REFERENCE TO RELATED APPLICATION

This application is a continuation of U.S. application Ser. No. 16/087,526, filed Sep. 21, 2018, the contents of which are incorporated herein by reference.

TECHNICAL FIELD

The present invention relates to a method for manufacturing an anisotropic conductive film containing conductive particles, and an anisotropic conductive film. The present application asserts priority based upon Japanese Patent Application No. 2016-092832 filed in Japan on May 2, 2016 and Japanese Patent Application No. 2017-085492 filed in Japan on Apr. 24, 2017, and hereby incorporates these applications by reference.

BACKGROUND ART

Anisotropic conductive films (ACF) for mounting electronic components such as IC chips are known in the related art. In addition, in recent years, the matter of using a mold having a plurality of opening parts to separate or arrange conductive particles in an anisotropic conductive film so as to be individually independent from adjacent conductive particles has been examined (for example, see Patent Document 1).

CITATION LIST

Patent Literature

Patent Document 1: JP 2014-060151 A

SUMMARY OF INVENTION

Technical Problem

Conductive particles used in a mold having a plurality of opening parts are classified to ensure that the particle diameter distribution becomes sharp so that the anisotropic connection is not hindered, and thus manufacturing costs are high.

Furthermore, with anisotropic conductive films for which conductive particles of significantly different particle diameters are arranged in a plan view, insufficiencies in the pushing in of the conductive particles are generated, and become a cause of conduction defects.

The present invention resolves the above-described problems, and provides an anisotropic conductive film manufacturing method capable of reducing manufacturing costs. The present invention also provides an anisotropic conductive film capable of suppressing the occurrence of conduction defects. The present invention also provides a filler disposition film manufacturing method capable of reducing manufacturing costs, and a filler disposition film.

Solution to Problem

The present inventors conducted diligent examinations, and as a result, discovered that manufacturing costs can be reduced by using a member having a plurality of opening parts, and sorting the conductive particles or filler. The inventors also discovered that with respect to a particle diameter distribution graph of conductive particles disposed in an anisotropic conductive film in a plan view, the occurrence of conduction defects can be suppressed by achieving a prescribed graph shape.

Namely, an anisotropic conductive film manufacturing method according to the present invention includes: a holding step of supplying conductive particles having a plurality of particle diameters onto a member having a plurality of opening parts, and holding the conductive particles in the opening parts; and a transfer step of transferring the conductive particles held in the opening parts to an adhesive film, wherein in a particle diameter distribution graph (X-axis: particle diameter ($\mu$m), Y-axis: number of particles) of the conductive particles held in the opening parts, the shape of the graph is such that the slope is substantially infinite in a range at or above a maximum peak particle diameter.

In addition, an anisotropic conductive film according to the present invention includes: an insulating binder formed in a film shape; and a plurality of conductive particles disposed in a plan view on the insulating binder, wherein in a particle diameter distribution graph (X-axis: particle diameter ($\mu$m), Y-axis: number of particles) of the conductive particles, the shape of the graph is such that the slope is substantially infinite in a range at or above a maximum peak particle diameter.

Furthermore, a film wound body according to the present invention is obtained by winding the anisotropic conductive film onto a winding core.

That is, a filler disposition film manufacturing method according to the present invention includes: a holding step of supplying a filler of a plurality of particle diameters onto a member having a plurality of opening parts, and holding the filler in the opening parts; and a transfer step of transferring the filler held in the opening parts to an adhesive film, wherein in a particle diameter distribution graph (X-axis: particle diameter ($\mu$m), Y-axis: number of particles) of the filler held in the opening parts, the shape of the graph is such that the slope is substantially infinite in a range at or above a maximum peak particle diameter.

In addition, a filler disposition film according to the present invention includes: an insulating binder formed in a film shape; and a plurality of fillers disposed in a plan view on the insulating binder, wherein in a particle diameter distribution graph (X-axis: particle diameter ($\mu$m), Y-axis: number of particles) of the filler, the shape of the graph is such that the slope is substantially infinite in a range at or above a maximum peak particle diameter.

Advantageous Effects of Invention

According to the present invention, manufacturing costs can be reduced by using a member having a plurality of opening parts, and sorting the conductive particles or filler. In addition, the occurrence of conduction defects can be suppressed by achieving a prescribed graph shape in a particle diameter distribution graph of conductive particles disposed in an anisotropic conductive film in a plan view.

BRIEF DESCRIPTION OF DRAWINGS

FIG. 9A illustrates a disposing step (S1), and FIG. 9B illustrates a curing step (S2).

DESCRIPTION OF EMBODIMENTS

Embodiments of the present invention will be described in detail hereinafter in the following order.
1. Anisotropic conductive film manufacturing method
2. Anisotropic conductive film
3. Connection structure manufacturing method, and connection structure
4. Filler disposition film manufacturing method, and filler disposition film.
5. Examples

1. Anisotropic Conductive Film Manufacturing Method

Figure 1:
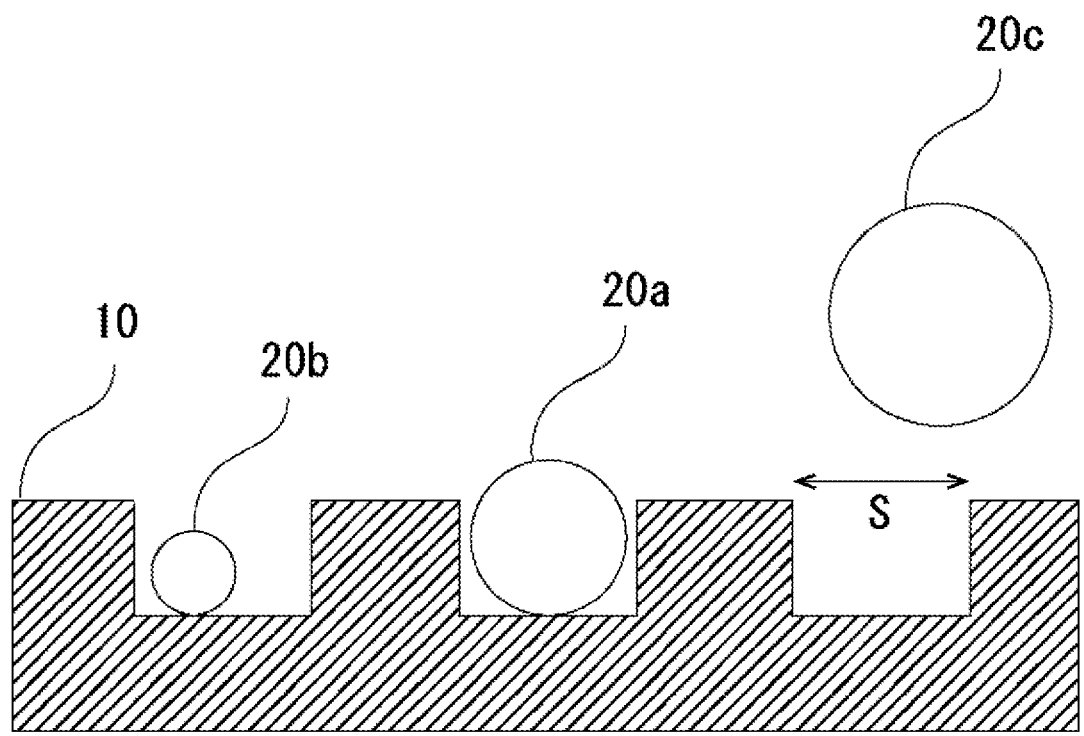
FIG. 1 is a cross-sectional view schematically illustrating a condition in which conductive particles have been supplied onto a member having a plurality of opening parts.

The anisotropic conductive film manufacturing method according to the present embodiment includes: a holding step (A) of supplying conductive particles having a plurality of particle diameters onto a member having a plurality of opening parts, and holding the conductive particles in the opening parts; and a transfer step (B) of transferring the conductive particles held in the opening parts to an adhesive film. The holding step (A) and the transfer step (B) are described below.
Holding Step (A)
Opening Member FIG. 1 is a cross-sectional view schematically illustrating a condition in which conductive particles have been supplied onto a member having a plurality of opening parts. As illustrated in FIG. 1, a member 10 is a mold having opening parts which have an opening size S of a prescribed opening diameter or opening width. Examples of the mold include metal materials such as stainless steel, transparent inorganic materials such as glass, and organic materials such as poly(meth)acrylate and crystalline resin. The opening parts can be formed by various techniques known as methods for forming opening parts. The opening formation method is not particularly limited, and for example, the opening parts may be provided through machine processing, or by using photolithography or a printing method. The mold may have various shapes such as a plate shape or a roll shape, and is not particularly limited.

The opening parts accommodate the conductive particles inside thereof, and examples of the shape of the opening parts include a cylindrical shape, a quadrangular prism shape, and other polygonal columnar shapes, a conical shape, a quadrangular pyramid shape, and other such pyramid shapes. The positions of the opening parts on the member, namely, the positions of the conductive particles disposed in a plan view on the anisotropic conductive film preferably have a specific shape and regularity, and preferably take on a regular arrangement such as a lattice shape or a staggered shape. Examples of the lattice shape include a rhombic lattice, a hexagonal lattice, a square lattice, a rectangular lattice, and a parallelotope lattice. The positions of the opening parts may also have regularity in a prescribed arrangement shape with respect to the long-side direction of the film.

The opening size S can be set on the basis of the particle diameter of the conductive particles disposed in the anisotropic conductive film. For example, the required ratio of the opening diameter to the particle diameter of the conductive particles (=(opening diameter)/(particle diameter of conductive particles)) preferably ranges from 1.1 to 2.0, and more preferably from 1.3 to 1.8 from the perspective of obtaining a good balance between, for example, ease of accommodation of the conductive particles and ease of pushing in of the insulating resin. In addition, for example, the ratio of the particle diameter of the conductive particles to the depth of the opening parts (=(particle diameter of conductive particles)/(depth of opening parts)) preferably ranges from 0.4 to 3.0, and more preferably from 0.5 to 1.5 from the perspective of obtaining a good balance between improvement of ease of transfer and the conductive particle holding property. The diameter and depth of the opening parts can be measured using a laser microscope. The average particle diameter of the conductive particles used in the production step can be measured through an image-type or laser-type particle size distribution measuring instrument. Note that use of an image-type particle size distribution measuring instrument is preferable because accurate particle sizes (particle diameters) can be obtained. An example of an image-type particle size distribution measuring instrument is the FPIA-3000 (from Malvern).

In addition, with regard to the opening size S, preferably, 60% or more of all of the opening parts are the same size, more preferably, 80% or more of all of the opening parts are the same size, and even more preferably, all of the opening parts are the same size. By differing the size of the opening parts, holding of any of the plurality of conductive particle diameters is facilitated, and by making the size of the opening parts the same, the particle diameters of the obtained anisotropic conductive film are more easily made uniform.

Furthermore, in either case, conductive particles that are significantly larger than the opening parts are substantially not held in the opening parts. This allows a graph shape in which the slope becomes substantially infinite in a range at or above the maximum peak particle diameter in the particle diameter distribution graph (X-axis: particle diameter (μm), Y-axis: number of particles) of the conductive particles held in the opening parts.

For a case in which conductive particles that are notably small relative to the opening parts are present, there is a concern that a plurality of particles could be held in an opening. However, unnecessary particles can be removed through a below-described conductive particle accommodation means. In a case where unnecessary conductive particles are not removed, minute conductive particles are present in a single opening, or are connected or adjacent in the vicinity of the opening, but it is known that such matter does not contribute to connection or has minimal impact, and therefore can be disregarded. This is because superposing in the connection direction of bumps due to resin flow at the time of connection is eliminated for the most part. Furthermore, an improvement in conduction performance is anticipated for cases in which conductive particles that have a relatively small size and contribute to connection are present. While these are conductive particles, when interposed and held between terminals, an effect of functioning as a spacer for larger conductive particles than those can be anticipated. Namely, conductive particles that have relatively small size and contribute to connection may possibly be insufficient to be in the interposing and holding state. However, such a state becomes a conduction point, improvements in conduction performance are anticipated, and the interposing and holding of conductive particles larger than this can be controlled at a certain range. Therefore, the ability to more easily obtain a good connection state can be expected. The conductive particles are preferably metal-coated resin particles because such particles are compressed, and thus the compression state can be controlled, and greater efficacy can be anticipated. It is also possible to reduce the compression hardness, and set the comparatively small conductive particles to a size in accordance with the purpose of the anisotropic connection. In this manner, the options for obtaining conduction performance are increased by adjusting the compression hardness of the conductive particles.

Furthermore, regularity may be imparted for a case in which the opening size S differs with respect to some of all of the opening parts. For example, opening parts having an opening size S from an upper limit to a lower limit size of the above-described ratio of opening diameters may be adjacently arranged, or opening parts having an opening size S of the upper limit or the lower limit size may be periodically provided in a direction that becomes the long-side direction of the anisotropic conductive film. This periodically repeating unit may be set from a bump width and a space (L/S) between bumps. In a case where the disposition of the opening parts is set so that conductive particles are present at the bumps with consideration of the bump width and space between bumps, the conductive particles can be reliably disposed at positions interposed and held by bumps. The distance between opening parts can be set as appropriate, but is preferably set to 0.5 times or more the targeted maximum conductive particle diameter of the conductive particles to be disposed, and can be set to be equal to or larger than the targeted maximum conductive particle diameter. Note that if consideration is given to the presence of comparatively small conductive particles, the distance between opening parts may be set to 1.5 times or more, and preferably 2 times or more the targeted maximum conductive particle diameter of the conductive particles to be disposed. This distance can be appropriately set based on the size of the conductive particles, on what the size is of conductive particles having a small particle diameter and on what the presence percentage is of these small particle diameter conductive particles.

Furthermore, the minimum and maximum opening parts are favorably repeated in pairs in order to hinder the occurrence of production defects in the connection structure and to reliably ensure conduction. Alternatively, a plurality of opening parts of a size between the maximum and minimum may be simultaneously provided. In this case, conductive particles of any size may be disposed in the anisotropic conductive film, and the matter of not disposing several may also be performed. That is, even in a case where any of the conductive particles are missing, when another is present, conduction can be satisfied. As one example, five or more conductive particles each is preferable, ten or more each is more preferable, and twelve or more each is even more preferable. The distance between conductive particles is preferably 0.5 times or more, and more preferably equal to or greater than the maximum conductive particle diameter. The disposition is preferably such that the conductive particles are generally present in a direction orthogonal to the long-side direction of the film. This is to satisfy capturing to one bump. When the conductive particles are disposed in this manner, in practical use, any of the conductive particles are captured at the time of connection, and therefore the occurrence of conduction defects can be avoided. For example, for a case in which the connection surface of the terminal (for example, the connection surface of an Au bump of an IC chip) irregularly has an uneven shape that is not smooth, it can be anticipated that when this type of pair is present, any of the conductive particles will be appropriately captured. In a case where the matter of the bump being not smooth can be allowed, cost merits for obtaining a connection body can be easily obtained such as improvements in yield when manufacturing the bumps and an expansion in the design quality tolerance range. Furthermore, in the case of Au bumps, an effect of being able to reduce the amount of Au that is used can also be expected. In addition, even for a case in which the connection surface of the terminal irregularly has an uneven shape that is not smooth, when the conductive particles are metal-coated resin particles, the conductive particles are compressed, and therefore it is thought that the uneven shape can be supported by adjusting the compression hardness. Note that the surface area increases when the connection surface irregularly has this type of uneven shape, and therefore when conductive particles of different sizes are present, it is surmised that contact points between the connection surface and the conductive particles increase in comparison to a case in which the conductive particles are a single size. For a case in which the connection surface of the terminal is smooth, an effect like that described above can be anticipated by adjusting the particle diameter and the compression hardness. Effects like that described above are premised on avoiding flaws or suppressing flaws to within a tolerance range by adjusting the disposal position of the conductive particles and the number density, and the like, in addition to the difference between the maximum and minimum conductive particle diameters and the hardness (compression hardness) of the conductive particles.

The technique for accommodating the conductive particles in the opening parts is not particularly limited, and a well-known technique can be adopted. For example, the conductive particles can be accommodated in the opening parts by scattering or applying onto an opening formation surface of a member 10, a dried conductive particle powder or a liquid dispersion obtained by dispersing the powder thereof in a solvent, and then squeegeeing the surface of the opening formation surface using a brush, blade or the like.

When accommodating the conductive particles in the opening parts, as illustrated in FIG. 1, conductive particles 20a and 20b that are smaller than the opening size S are accommodated inside the opening parts, but conductive particles 20c that are larger than the opening size S are not accommodated in the opening parts, and sorting can be performed to exclude conductive particles with a large particle diameter. Through this, manufacturing costs can be reduced. In addition, costs can also be reduced by collecting conductive particles after squeegeeing and reusing those conductive particles.

Conductive Particles

As the conductive particles, those that are used in known anisotropic conductive films can be appropriately sorted and used. Examples include metal particles such as nickel, copper, silver, gold, and palladium, and metal-coated resin particles, where the surface of resin particles such as polyamide and polybenzoguanamine is coated with a metal such as nickel. The size of the conductive particles to be disposed is, as one example, preferably from 0.5 to 50 μm, and more preferably from 1 to 30 μm.

From the perspective of ease of handling during manufacturing, the average particle diameter of the conductive particles that are supplied in the holding step (A) is preferably such that particle diameters from 0.5 to 50 μm account for 90% or more of the total particle amount. Note that conductive particles of a size of less than 1 μm and of a size of greater than 30 μm are preferably removed in the holding step. As described above, the average particle diameter can be measured using an image-type particle size distribution measuring instrument, and can be measured from surface observations (surface visual field observations) after the holding step.

In addition, the surface of the conductive particles is preferably covered with an insulator. Accommodating the conductive particles in the opening parts is facilitated even when the opening size S is somewhat larger than the conductive particle by providing a surface coating that easily peels from the surface and does not impede anisotropic connections, on the surface of the conductive particles. Examples of such a surface coating include an insulation coating and an insulating particle treatment. The thickness of this type of surface coating differs depending on the connection target, and therefore is not particularly limited as long as the thickness does not impede connections.

Furthermore, in a case where protrusions of the conductive particles are provided at the surface, preferably the protrusion is of a size that is within 20%, and preferably within 10% of the minimum conductive particle diameter. The quantity is not particularly limited, and the conductive particles may be provided uniformly over the entire surface, or may be sparsely provided.

In addition, the conductive particles are a mixture of particles with different particle diameters, and therefore the conductive particles are preferably particles with comparatively high compressibility. Namely, use of metal-coated resin particles is preferable. The hardness varies depending on the connection target, and therefore is not particularly limited, but as one example, the compression hardness (K-value) at 20% deformation is favorably in a range from 1000 to 8000 N/mm², and is preferably in a range from 1000 to 4000 N/mm². In addition, the conductive particles may be an intentional mixture of particles of different hardnesses.

Herein, the compression hardness (K-value) at 20% deformation refers to a numeric value calculated by the following equation (1) from a load when the particle diameter of the conductive particles is reduced by 20% compared to the original particle diameter by applying the load in one direction to the conductive particles to thereby compress the conductive particles. As the K-value becomes smaller, the particle is softer.

$$K=(3/\sqrt{2})F \cdot S^{-8/2} \cdot R^{-1/2} \quad (1)$$

(where, F: load at 20% compression deformation of a conductive particle;
S: compression displacement (mm); and
R: radius (mm) of the conductive particle)

Particle Diameter Distribution

Figure 2A:
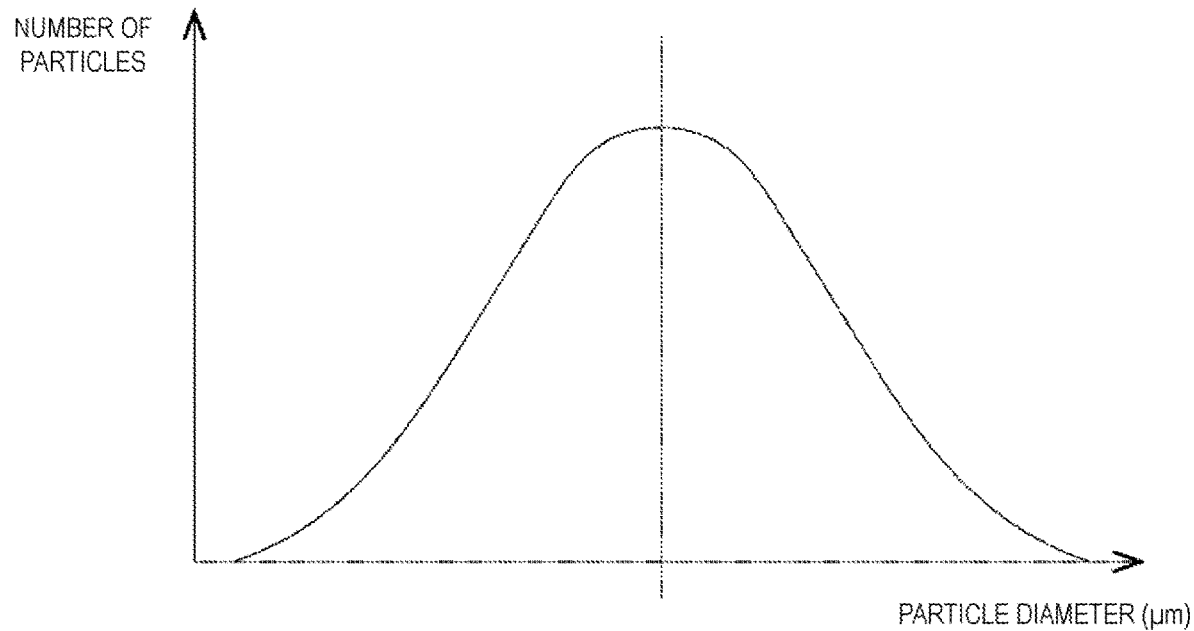
FIG. 2A is a graph schematically showing a particle diameter distribution of conductive particles supplied to the opening parts.
Figure 2B:
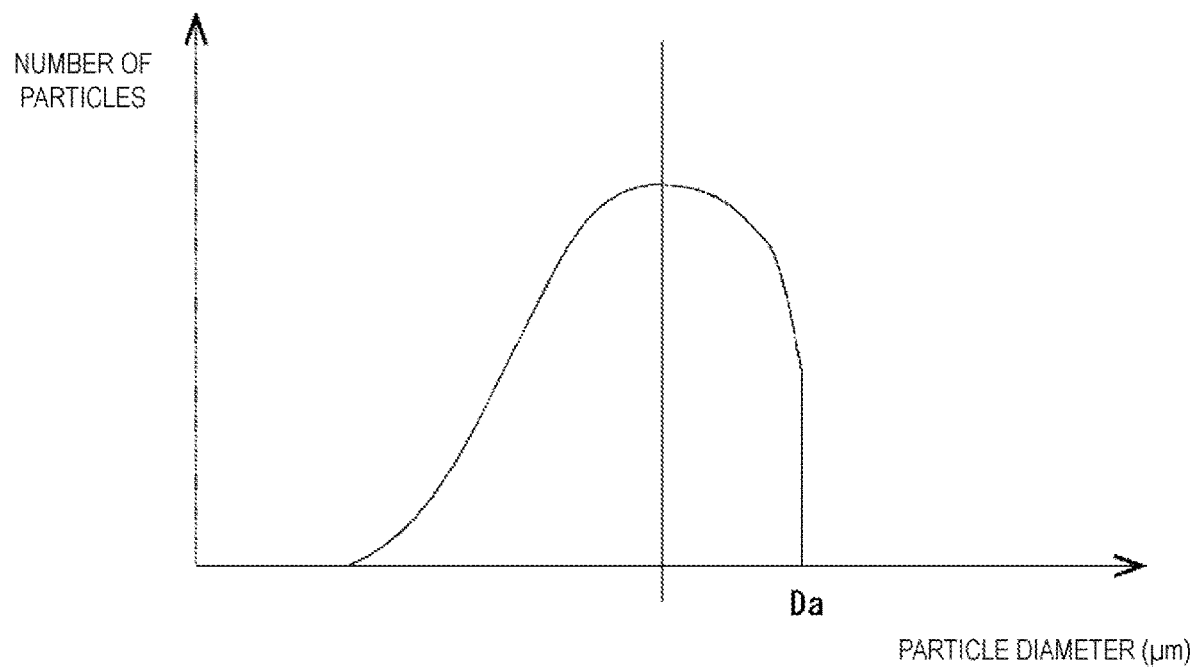
FIG. 2B is a graph schematically showing the particle diameter distribution of conductive particles held in the opening parts.

FIG. 2A is a graph schematically showing a particle diameter distribution of conductive particles supplied to the opening parts, and FIG. 2B is a graph schematically showing the particle diameter distribution of conductive particles held in the opening parts. This particle diameter distribution graph is a numeric distribution for which the maximum length (particle diameter) of a quantity of 1000 or more, and preferably 5000 or more conductive particles was measured by surface visual field observation using an optical microscope or a metallurgical microscope. As illustrated in FIG. 2A, the present method is favorable even when the particle diameter distribution of conductive particles supplied to the opening parts is wide (even when broad). Therefore, an effect of being able to easily obtain balance between performance and cost can be expected including the use of particles for which the lower limit side of the particle diameter has been classified, and a merit of an increase in usable options is obtained.

As illustrated in FIG. 2A, with the present embodiment, conductive particles having a wide particle diameter distribution are supplied to the opening parts, but as illustrated in FIG. 2B, the particle diameter distribution graph (X-axis: particle diameter (μm), Y-axis: number of particles) of the conductive particles held in the opening parts becomes a graph shape in which the slope becomes substantially infinite in a range at or above the maximum peak particle diameter. In particular, as the percentage of opening parts having the same size increases, a threshold Da that is roughly parallel to the Y-axis and has a slope that becomes substantially infinite is obtained. In the particle diameter distribution, the slope becoming substantially infinite means having a straight line that is parallel to the Y-axis, and also includes a slope that approximates a line that is parallel to the Y-axis. In addition, in the particle diameter distribution, the slope becoming substantially infinite can also be rephrased as having a vertical tangent.

Figure 3:
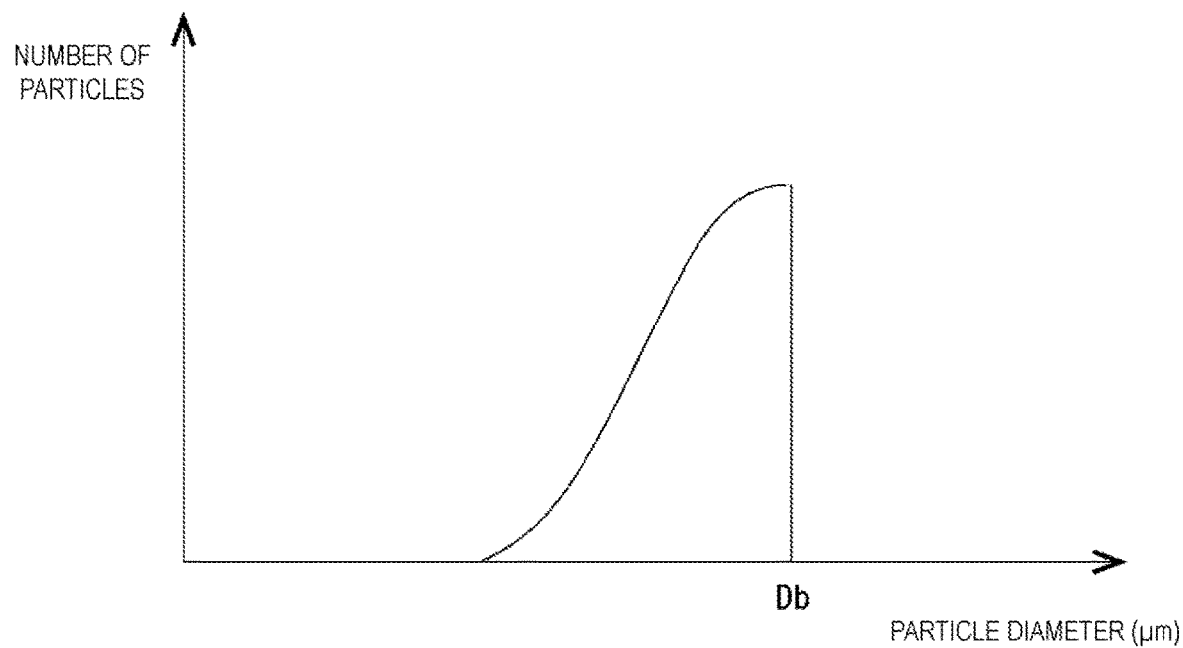
FIG. 3 is a graph schematically showing another example of a particle diameter distribution of conductive particles held in the opening parts.
Figure 4:
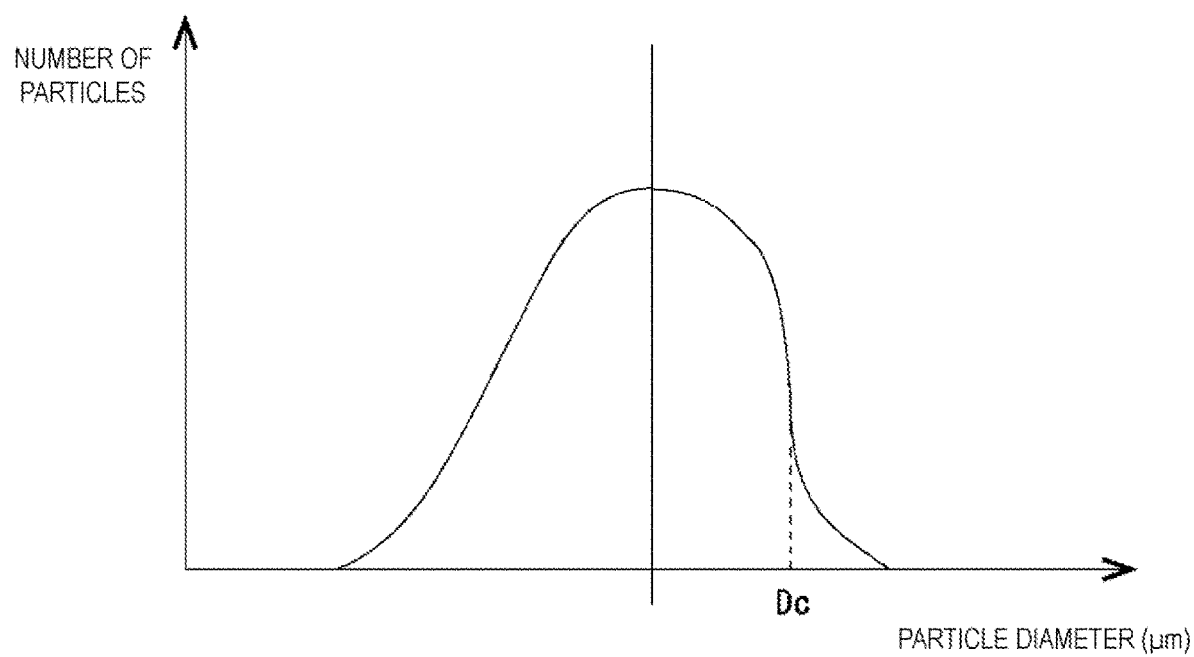
FIG. 4 is a graph schematically showing another example of a particle diameter distribution of conductive particles held in the opening parts.

Furthermore, the particle diameter distribution of the conductive particles held in the opening parts is not limited to the graph shape illustrated in FIG. 2B, and for example, may be such that the slope becomes substantially infinite at a maximum peak particle diameter Db as illustrated in FIG. 3, and may be such that conductive particles of a particle diameter equal to or greater than a particle diameter Dc at which the slope becomes substantially infinite are somewhat present as illustrated in FIG. 4. As with these graphs shapes, an upper limit of the particle diameter of the conductive particles exists, and the number of particles near the upper limit is large, and thereby conductive particles for which pushing in is insufficient are relatively reduced, suppressing the occurrence of conduction defects.

Figure 5:
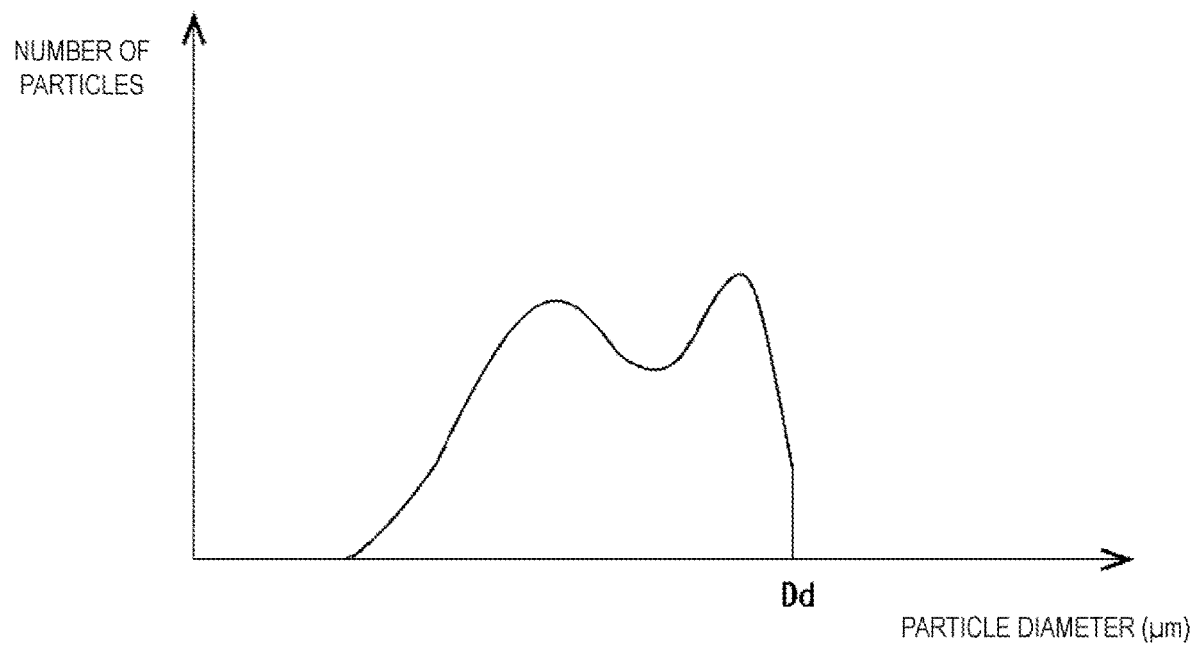
FIG. 5 is a graph schematically showing another example of a particle diameter distribution of conductive particles held in the opening parts.

Furthermore, as illustrated in FIG. 5, the particle diameter distribution of the conductive particles held in the opening parts may take on a shape in which a plurality of peaks are present (bottom is present between peaks), and the slope may become substantially infinite at a particle diameter Dd. A case in which a plurality of peaks are present includes, for example, a case in which two types of metal-coated resin particles with different particle diameters are mixed. The contact points between the connection surface and the conductive particles can be increased by adjusting the compression hardness of the metal-coated resin particles, and the conduction performance can be thereby improved.

In addition, as the conductive particles to be supplied, particles for which the lower limit side of the particle diameter has been classified are preferably used. Conductive particles with very small particle diameters do not contribute to connection, and thus do not have much effect on conductivity. Therefore, with COG connections and the like that require a comparatively large amount of conductive particles, the use of particles for which the lower limit side of the particle diameter has been classified can suppress matters such as the unnecessary superposing of conductive particles (conductive particles overlapping in the thickness direction) while keeping a good balance with cost. Furthermore, by using conductive particles for which the lower limit side of the particle diameter has been classified, a larger number of comparatively small conductive particles of a size that contributes to connection are held in the opening parts. Therefore, it can be expected that effects can be easily adjusted such as the spacer effect that controls to within a constant range the interposing and holding of conductive particles that are larger than the comparatively small size conductive particles and contribute to connection.

As the method for classification of the lower limit side of the particle diameter, various known techniques can be used. An example is a wet classification method in which vibration having an amplitude from 0.2 to 40 μm is applied to conductive particles in a liquid, and classification is performed through a sieve having a standard deviation of the short diameter of 10% or less (for example, Japanese Unexamined Patent Application Publication No. H11-319626 A).

Figure 6A:
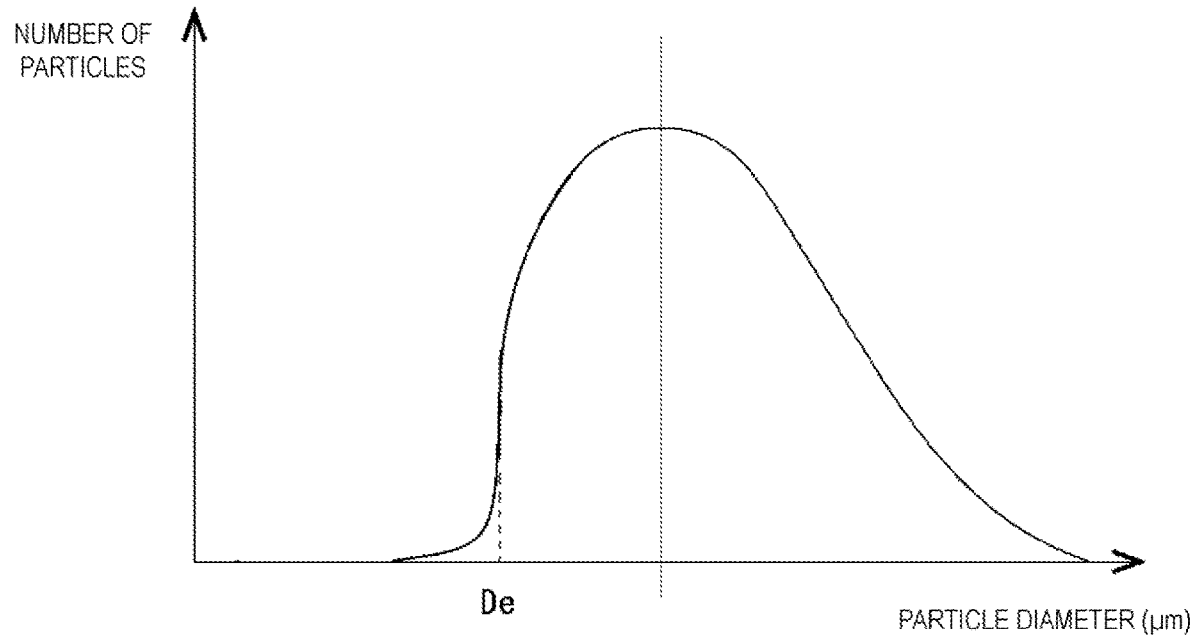
FIG. 6A is a graph schematically showing a particle diameter distribution of conductive particles for which the lower limit side of the particle diameter has been sorted and which are supplied to the opening parts.
Figure 6B:
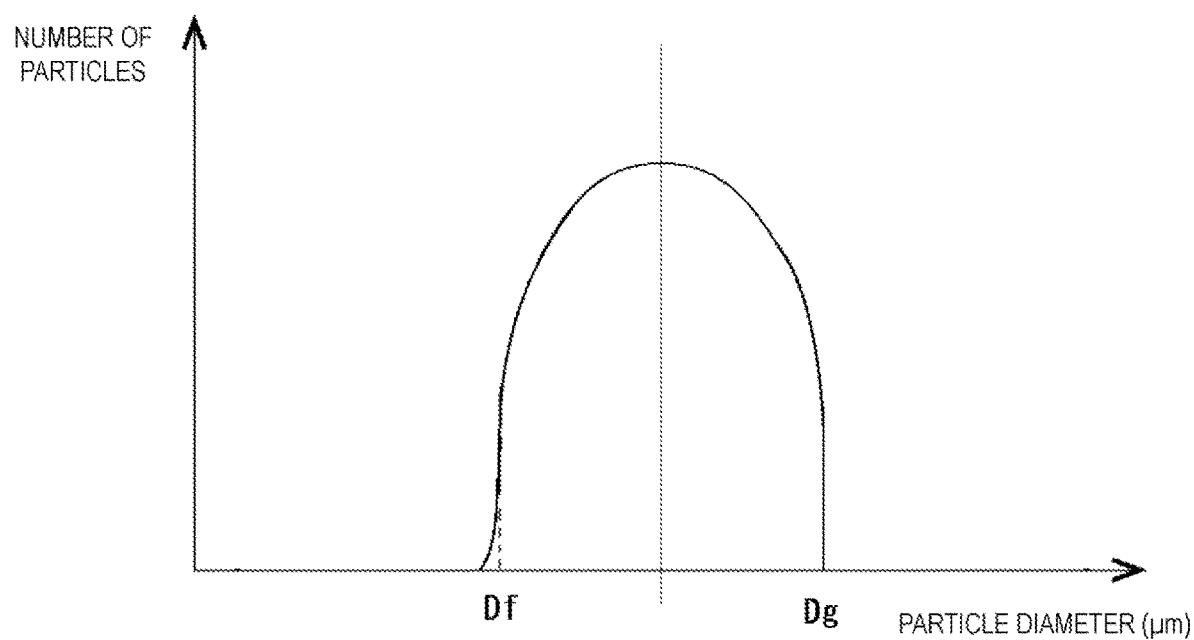
FIG. 6B is a graph schematically showing the particle diameter distribution of conductive particles held in the opening parts.

FIG. 6A is a graph schematically showing a particle diameter distribution of conductive particles for which the lower limit side of particle diameters has been classified and which are supplied to the opening parts, and FIG. 6B is a graph schematically showing the particle diameter distribution of conductive particles held in the opening parts. Preferably, as illustrated in FIG. 6A, a particle diameter De at which the slope is substantially infinite in a range at or below the maximum peak particle diameter exists in the particle diameter distribution graph (X-axis: particle diameter (μm), Y-axis: number of particles) of the conductive particles that are supplied. Through this, as illustrated in FIG. 6B, the particle diameter distribution graph (X-axis: particle diameter (μm), Y-axis: number of particles) of the conductive particles held in the opening parts exhibits a particle diameter Df at which the slope becomes substantially infinite in a range at or below the maximum peak particle diameter, and exhibits a particle diameter Dg at which the slope becomes substantially infinite in a range at or above the maximum peak particle diameter.

Figure 7:
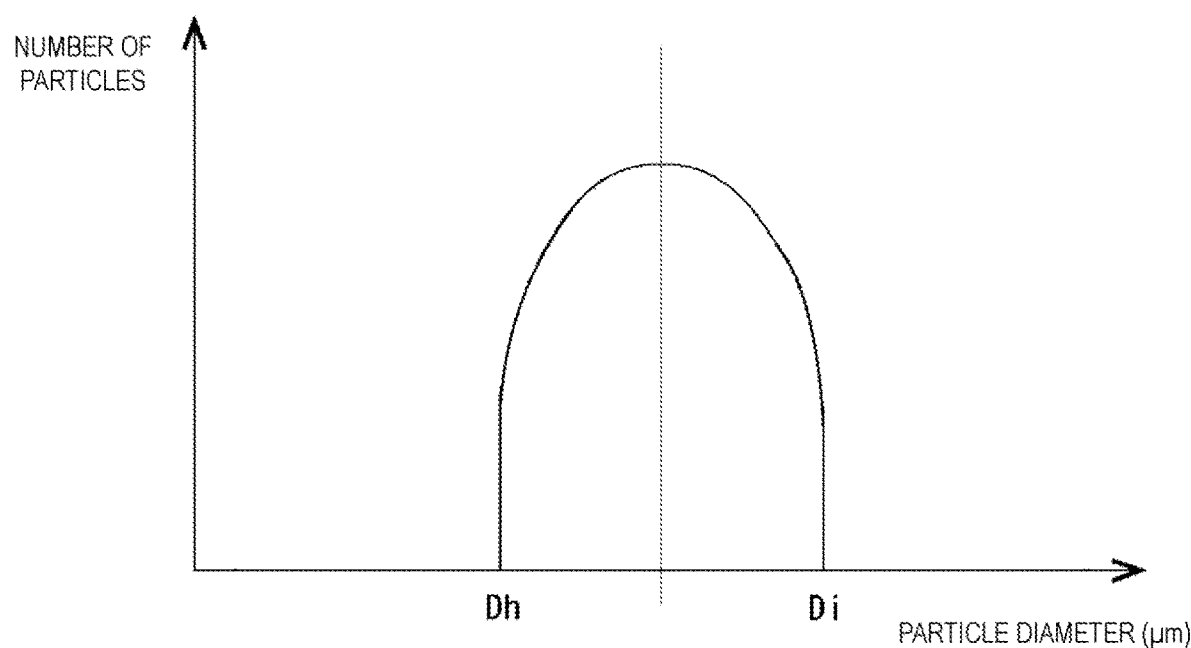
FIG. 7 is a graph schematically showing another example of a particle diameter distribution of conductive particles held in the opening parts.

In addition, as illustrated in FIG. 7, the particle diameter distribution graph (X-axis: particle diameter (μm), Y-axis: number of particles) of the conductive particles held in the opening parts may have a threshold Di that is roughly parallel to the Y-axis and at which the slope becomes substantially infinite in a range at or above the maximum peak particle diameter, along with having a threshold Dh that is roughly parallel to the Y-axis and at which the slope becomes substantially infinite in a range at or below the maximum peak particle diameter.

Furthermore, for a case in which conductive particles for which the lower limit side of the particle diameter has been classified are used, to make the pressure of the conductive particles at the time of compression bonding uniform, the conductive particles that are held in the opening parts are such that preferably 90% or more of the total particle count is present in a range of ±30% of the average particle diameter, and more preferably 90% or more of the total particle count is present in a range of ±20% of the average particle diameter. By using conductive particles for which the lower limit side of the particle diameter was classified in advance in this manner, the capture rate of conductive particles captured in bumps can be improved.

Note that the present invention is not limited to the shapes of the particle diameter distribution graphs illustrated in FIGS. 2 to 7, and the graphs can take on various shapes within a scope that does not deviate from the gist of the present invention. For example, the graph shape illustrated in FIG. 7 is a warhead shape with left-right symmetry, but the graph may also be non-left-right symmetrical.

Transfer Step (B)

Figure 8:
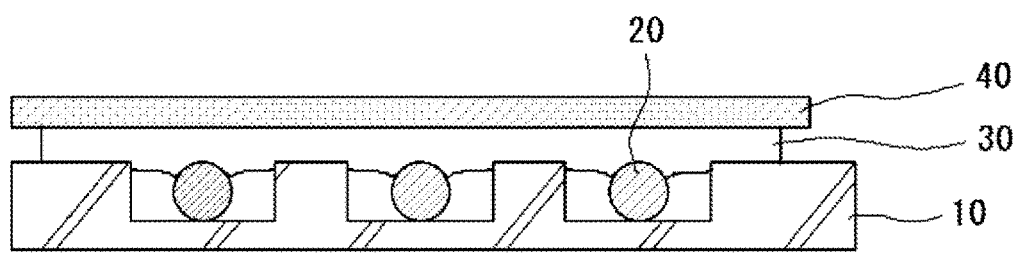
FIG. 8 is a cross-sectional view schematically illustrating a condition in which an adhesive film is made to oppose in the transfer step.

In the subsequent transfer step (B), first, as illustrated in FIG. 8, an adhesive film 30 is positioned opposing the surface of the member 10 in which the opening parts are formed.

As the adhesive film 30, one which is used as an insulating binder layer in a known anisotropic conductive film can be appropriately selected and used. In addition, examples of the type of curing of the adhesive film 30 include thermosetting, photocuring, and photo-heat combination curing. For example, it is possible to use a photoradical polymerizable resin layer including an acrylate compound and photoradical polymerization initiator, a thermal radical polymerizable resin layer including an acrylate compound and a thermal radical polymerization initiator, a thermal cationic polymerizable resin layer including an epoxy compound and a thermal cationic polymerization initiator, a thermal anionic polymerizable resin layer including an epoxy compound and a thermal anionic polymerization initiator, and the like, or a curable resin layer thereof.

As one example, an anionic curing-type adhesive film is described below. An anionic-curing type adhesive film contains a film-forming resin, an epoxy resin, and an anionic polymerization initiator.

The film-forming resin corresponds to a high-molecular-weight resin having an average molecular weight of not less than 10000, for example, and an average molecular weight from approximately 10000 to approximately 80000 is preferable from the perspective of film formability. Examples of film-forming resins include various resins such as phenoxy resins, polyester resins, polyurethane resins, polyester urethane resins, acrylic resins, polyimide resins, and butyral resins. These may be used alone, or two or more types may be used in combination. Of these, a phenoxy resin is preferably used from the perspective of film formation state, connection reliability, and the like.

An epoxy resin forms a three-dimensional mesh structure so as to provide good heat resistance and adhesiveness, and a solid epoxy resin and a liquid epoxy resin are preferably used in combination. Here, a solid epoxy resin refers to an epoxy resin which is a solid at room temperature. In addition, a liquid epoxy resin refers to an epoxy resin which is a liquid at room temperature. Room temperature refers to the temperature range from 5 to 35° C. as prescribed by JIS Z 8703.

The solid epoxy resin is not particularly limited as long as it is compatible with the liquid epoxy resin and is a solid at room temperature, and examples thereof include bisphenol A epoxy resins, bisphenol F epoxy resins, polyfunctional epoxy resins, dicyclopentadiene epoxy resins, novolac phenol epoxy resins, biphenyl epoxy resins, and naphthalene epoxy resins. One type of these may be used alone, or two or more types may be used in combination. Of these, it is preferable to use a bisphenol A epoxy resin.

The liquid epoxy resin is not particularly limited as long as it is a liquid at room temperature, and examples include bisphenol A epoxy resins, bisphenol F epoxy resins, novolac phenol epoxy resins and naphthalene epoxy resins. One type of these may be used alone, or two or more types may be used in combination. In particular, it is preferable to use a bisphenol A epoxy resin from the perspective of tackiness of the film, flexibility or the like.

A known curing agent that is ordinarily used can be used as the anionic polymerization initiator. Examples include organic acid dihydrazide, dicyandiamide, amine compounds, polyamide amine compounds, cyanate ester compounds, phenol resins, acid anhydrides, carboxylic acid, tertiary amine compounds, imidazole, Lewis acids, Bronsted acid salts, polymercaptan-based curing agents, urea resins, melamine resins, isocyanate compounds, and block isocyanate compounds. One type of these may be used alone, or two or more types may be used in combination. Of these, it is preferable to use a microcapsule-type latent curing agent formed by using an imidazole-modified substance as a core and covering the surface thereof with polyurethane.

In addition, stress relaxation agents, silane coupling agents, inorganic fillers, or the like may also be compounded as necessary. Examples of stress relaxation agents include hydrogenated styrene-butadiene block copolymers and hydrogenated styrene-isoprene block copolymers. Examples of silane coupling agents include epoxy-based, methacryloxy-based, amino-based, vinyl-based, mercapto-sulfide-based, and ureide-based silane coupling agents. Examples of inorganic fillers include silica, talc, titanium oxide, calcium carbonate, and magnesium oxide.

Note that the adhesive film 30 can be formed by forming a film through a method of applying a coating composition containing a resin like that described above, and then drying, and further curing, or by forming a film in advance using a well-known technique. The thickness of the adhesive film 30 is preferably from 1 to 30 μm and more preferably from 2 to 15 μm. Note that an insulating binder layer of these thicknesses may be laminated as necessary. Furthermore, the adhesive film 30 is preferably formed on a release film 40 such as a polyethylene terephthalate film that has been release treated.

Even when pressure is applied to the adhesive film 30 from the release film 40 side, and the insulating binder layer is pushed into the opening parts, the conductive particles 20 may be transferred so as to be embedded in the surface of the insulating binder layer, or the conductive particles may be pushed into the insulating binder layer after the transfer. The adhesive film 30 may be laminated as described above before or after these steps. Through this, a structure is formed in which the conductive particles 20 are arranged in a single layer in the planar direction of the insulating binder layer. Note that the conductive particles are preferably located at a position close to the outermost surface of the adhesive film 30 from the perspective of satisfying capturing when connecting.

The minimum melt viscosity of the entire insulating binder layer is preferably from 100 to 10000 Pa·s. A minimum melt viscosity within this range makes it possible to precisely arrange the conductive particles in the insulating binder layer, and also makes it possible to prevent resin flow from hindering the capturing performance of the conductive particles due to pushing in when making an anisotropic conductive connection. The minimum melt viscosity can be determined, for example, by using a rotary rheometer (available from TA Instruments), constantly maintaining the rate of temperature increase at 10° C./min and the measurement pressure at 5 g, and using a measurement plate having a diameter of 8 mm.

2. Anisotropic Conductive Film

The anisotropic conductive film according to the present embodiment includes: an insulating binder formed in a film shape; and a plurality of conductive particles disposed in a plan view on the insulating binder; and in a particle diameter distribution graph (X-axis: particle diameter (μm), Y-axis: number of particles) of the conductive particles, the shape of the graph is such that the slope is substantially infinite in a range at or above a maximum peak particle diameter. The particle diameter of the X-axis is preferably in range from 1 to 30 μm. This particle diameter distribution graph is a numeric distribution for which the maximum length (particle diameter) of a quantity of 1000 or more, and preferably 5000 or more conductive particles was measured by surface visual field observation using an optical microscope or a metallurgical microscope.

In addition, the shape of the particle diameter distribution graph (X-axis: particle diameter (μm), Y-axis: number of particles) of the conductive particles is broad. Here, a broad shape means that the difference in a cumulative distribution between a particle diameter $D_{10}$ of a quantity accumulation of 10% from the small side of the particle diameter and a particle diameter $D_{90}$ of a quantity accumulation of 90% thereof is 1 μm or greater. Alternatively, a broad shape means that the difference in a cumulative distribution between the particle diameter $D_{10}$ of a quantity accumulation of 10% from the small side of the particle diameter and the particle diameter $D_{90}$ of a quantity accumulation of 90% thereof is greater than 25% of the average particle diameter. The quantity accumulation of 10% indicates the size (particle diameter) with respect to a 10% quantity when the measured particles are rearranged in the order of size (particle diameter) based on the total quantity of the measured particles being 100%.

With respect to the above-described manufacturing method, the conductive particles accommodated in the opening parts become the conductive particles that are disposed in a plan view in the anisotropic conductive film. That is, as described using the particle diameter distribution graphs illustrated in FIGS. 2 to 7, with the anisotropic conductive film according to the present embodiment, conductive particles for which the upper limit side of the particle diameter has been sorted are disposed, and an upper limit exists for the particle diameter of the conductive particles, and the occurrence of conduction defects can be suppressed by using a large number of particles near the upper limit. Note that conduction particles of very small particle diameters do not contribute to connection, and therefore have very little impact on conductivity. In addition, conductive particles with a wide particle diameter distribution, or in other words, relatively low-cost particles that have not been classified or have been subjected to a minimum level of classification can be used, and therefore such conductive particles can contribute to a reduction in material costs. Moreover, as described above, by adjusting the size and hardness (compression hardness) of the conductive particles, an effect of improving the conduction property can be expected.

In a case where the conductive particles have not been classified or the minimum level of classification has not been performed, the particle diameter distribution graph (X-axis: particle diameter (μm), Y-axis: number of particles) of the conductive particles disposed in the anisotropic conductive film may be a shape in which a plurality of peaks are present (bottom is present between peaks). This is because it is uncertain which types of various conductive particle diameters are present before classification. However, this is not particularly problematic because, as described above, a hindrance is not brought about as long as there is no superposing in the thickness direction at the time of connection.

In addition, in a case where a mixture of conductive particles of different hardnesses is used, this type of graph shape can be intentionally formed. For example, when conductive particles with a relatively hard hardness generate a peak at a relatively small particle diameter, and conductive particles with a relatively soft hardness generate a peak for a relatively large particle diameter, an effect of increasing the capturing efficiency is anticipated. Furthermore, the pushing in of the conductive particles can also be regulated, thereby contributing to conduction stability. In this case, the particle diameters of the conductive particles are each measured in advance before the holding step, simple sorting may be implemented for respective particle diameters, and adjustments may be made so that appropriate peaks are obtained in general. Alternatively, conductive particles which exhibit respectively different particle diameter distributions may be prepared, and conductive particles may be mixed together so as to obtain generally appropriate peaks.

Furthermore, the particle diameter distribution graph (X-axis: particle diameter (μm), Y-axis: number of particles) of the conductive particles that are disposed in the anisotropic conductive film preferably exhibits a particle diameter at which the slope becomes substantially infinite in a range at or below the maximum peak particle diameter. Through this, as illustrated in FIG. 6B, the particle diameter distribution graph (X-axis: particle diameter (μm), Y-axis: number of particles) of the conductive particles held in the opening parts exhibits a particle diameter $D_f$ at which the slope becomes substantially infinite in a range at or below the maximum peak particle diameter, and exhibits a particle diameter $D_g$ at which the slope becomes substantially infinite in a range at or above the maximum peak particle diameter. Furthermore, to make the pressure of the conductive particles at the time of compression bonding uniform, preferably 90% or more of the total particle count is present in a range of ±30% of the average particle diameter, and more preferably 90% or more of the total particle count is present in a range of ±20% of the average particle diameter. By using conductive particles for which the lower limit side of the particle diameter has been classified in advance in this manner, the capture rate of conductive particles captured in bumps can be improved.

When the opening parts of the member are covered by conductive particles with a large particle diameter in the above-described holding step (A), conductive particles are then later removed with a squeegee, opening parts not holding conductive particles are produced, and "omissions" of conductive particles are generated in the anisotropic conductive film. These omissions are not a problem as long as the omissions are within a range that does not hinder the anisotropic connection.

In addition, the tolerance range of the omission rate of the anisotropic conductive film differs depending on the bump layout of the connection target. The omission rate is a ratio of the number of conductive particles that are present in the length of the film in the width direction to the number of particles that are present in the length of the film in the long-side direction. For example, when the bumps are disposed in a highly dense manner as with COG, the omission rate needs to be reduced, and for example, when the bump surface area is relatively large as with FOG, there is no problem when the omission rate is large.

Furthermore, preferably, no deviation is present in the omissions. For the same reasons as those described above, this deviation needs to be small with COG, but with FOG, a problem does not exist even when the deviation is generally large.

The usage length and width of the anisotropic conductive film per time varies depending on the connection target, but ordinarily, a maximum of around 20 mm×2 mm is the upper limit. Therefore, when the conductive particle diameter is 10 μm or less, a continuous surface area of two times, preferably five times, and more preferably ten times the surface area of 40 mm$^2$ is set as the overall surface area of the anisotropic conductive film, and when a significant difference (deviation) does not exist with any optionally extracted 1 mm$^2$ surface area from amongst this surface area, the connection will not be hindered. This 1 mm$^2$ surface area is preferably extracted from ten locations by (non-continuously) sampling a surface area of 50 μm in the long-side direction of the film and 200 μm in the width direction of the film. Generally, the width direction of the film is the long-side direction of the bumps to be anisotropically connected, and the long-side direction of the film is the width direction of the bumps, and therefore the surface area to be evaluated is preferably a rectangular shape with the long-side direction of the film being short.

When the conductive particle diameter is larger than 10 μm and not more than 30 μm, the overall surface area of the film is left as is, the long-side direction and width direction of the film of the surface area to be extracted are each doubled, a 100 μm×400 μm surface area is extracted from ten non-continuous locations, and a total of 4 mm$^2$ is favorably evaluated. Note that for a case in which the film width is less than 400 μm, the rectangular shape may be changed as appropriate, An omission deviation for which a large number of omissions are present such as a case in which the number density of a specific location becomes small is not preferable. The minimum value of this type of omission is preferably 50% or greater, more preferably 60% or greater, and even more preferably 70% or greater with respect to the maximum value of the number density of the above-described ten locations of 50×200 μm or 100×400 μm.

As an example of the omission deviation, the total surface area optionally extracted with respect to the conductive particle number density of the above-described overall surface area is preferably a difference of (1 mm$^2$)±30%, and more preferably a difference of ±20%. When the omission deviation is within this numeric range, both cost and performance aspects can be easily achieved.

Film Wound Body

To continuously connect electronic components, the above-described anisotropic conductive film is preferably a film wound body obtained by winding the film onto a roll. The length of the film wound body is favorably 5 m or longer, and is preferably 10 m or longer. An upper limit does not particularly exist, but from the perspective of the ease of handling of the shipping article, the length of the film wound body is preferably 5000 m or less, more preferably 1000 m or less, and even more preferably 500 m or less.

The film wound body may also be one for which an anisotropic conductive film that is shorter than the total length is connected by a connection tape. A plurality of connection locations may be present, and the connection locations may be regularly present, or may be randomly present. The thickness of the connection tape is not particularly limited as long as the thickness does not hinder performance, but when the tape is too thick, resin protrusion and blocking are affected, and therefore the thickness is preferably from 10 to 40 μm. The film width is also not particularly limited, but for example, may be from 0.5 to 5 mm.

According to a film wound body of this type, a continuous anisotropic connection can be achieved, and this contributes to reducing the cost of the connection body.

3. Connection Structure Manufacturing Method, and Connection Structure

The connection structure manufacturing method according to the present invention includes: a disposing step (S1) of disposing a first electronic component and a second electronic component with an anisotropic conductive film interposed therebetween, the anisotropic conductive film including: an insulating binder formed in a film shape, and a plurality of conductive particles disposed in a plan view on the insulating binder, wherein in a particle diameter distribution graph (X-axis: particle diameter (μm), Y-axis: number of particles) of the conductive particles, the shape of the graph is such that the slope is substantially infinite in a range at or above a maximum peak particle diameter; and a curing step (S2) of compression bonding the second electronic component to the first electronic component through a compression bonding tool, and curing the anisotropic conductive film.

Figure 9A:
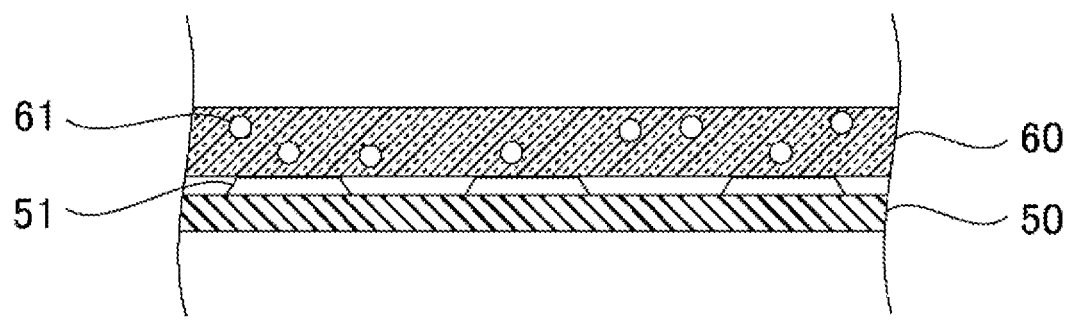
FIGS. 9A and 9B are cross-sectional views schematically illustrating a method of manufacturing a connection body according to the present embodiment.
Figure 9B:
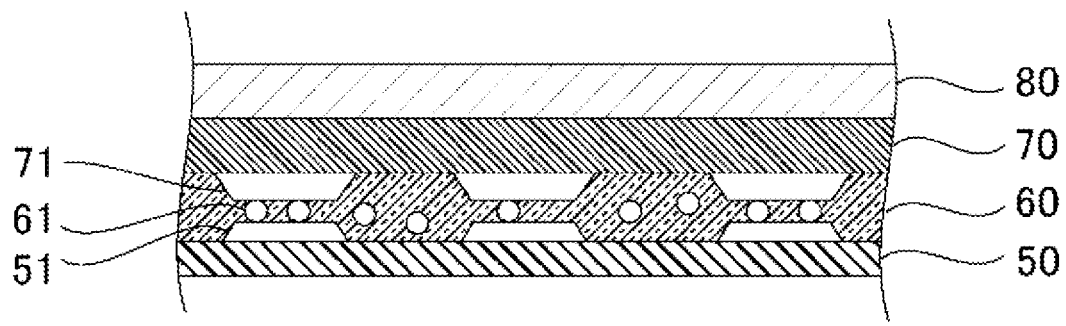

FIG. 9 is a cross-sectional view schematically illustrating a method of manufacturing a connection body according to the present embodiment; FIG. 9A illustrates the disposing step (S1), and FIG. 9B illustrates the curing step (S2). Note that the anisotropic conductive adhesive film is the same as that described above, and therefore the description thereof is omitted here.

Disposing Step (S1)

As illustrated in FIG. 9A, in the disposing step (S1), a first electronic component 50 and a second electronic component 70 are disposed with an anisotropic conductive film 60 interposed therebetween, the anisotropic conductive film 60 including: an insulating binder formed in a film shape, and a plurality of conductive particles disposed in a plan view on the insulating binder, wherein in a particle diameter distribution graph (X-axis: particle diameter (μm), Y-axis: number of particles) of the conductive particles, the shape of the graph is such that the slope is substantially infinite in a range at or above a maximum peak particle diameter.

The first electronic component 50 includes a first terminal row 51. The first electronic component 50 is not particularly limited and may be selected appropriately in accordance with the purpose. Examples of the first electronic component 50 include liquid crystal display (LCD) panels, organic EL (OLED) and other such flat panel display (FPD) applications, touch panel applications, and other such transparent substrates, printed wiring boards (PWB). The material of the printed wiring board is not particularly limited, and for example, an FR-4 base material or other such glass epoxy may be used, or thermoplastic resins and other such plastics, ceramics, and the like can be also used. In addition, the transparent substrate is not particularly limited as long as it exhibits a high level of transparency, and examples include glass substrates, and plastic substrates.

The second electronic component 70 includes a second terminal row 71 opposing the first terminal row 51. The second electronic component 70 is not particularly limited and may be selected appropriately in accordance with the purpose. Examples of the second electronic component 70 include integrated circuits (ICs), flexible printed circuits (FPCs), tape carrier package (TCP) substrates, and chips on film (COFs) having an IC mounted on an FPC.

Curing Step (S2)

As illustrated in FIG. 9B, in the curing step (S2), the second electronic component 70 is compression bonded to the first electronic component 50 through a compression bonding tool 80. Through this, the second electronic component is sufficiently pushed in by the compression bonding tool 80, and the resin is cured in a state in which the conductive particles 61 are interposed and held between the terminals.

According to this type of method for manufacturing a connection structure, excellent conductivity can be obtained similar to the case in which an anisotropic conductive film that contains pre-classified conductive particles is used.

The connection structure according to the present invention includes: a first electronic component, a second electronic component, and an adhesive film to which the first electronic component and the second electronic component are adhered; wherein the adhesive film is obtained by curing an anisotropic conductive film including: an insulating binder formed in a film shape; and a plurality of conductive particles disposed in a plan view on the insulating binder; and for which in a particle diameter distribution graph (X-axis: particle diameter (μm), Y-axis: number of particles) of the conductive particles, a shape of the graph is such that the slope is substantially infinite in a range at or above a maximum peak particle diameter.

According to this type of connection structure, excellent conductivity can be obtained similar to the case in which an anisotropic conductive film that contains pre-classified conductive particles is used and adhered.

Note that the present invention is not limited to application in the above-described connection structure manufacturing method, and can also be applied when stacking and creating multiple layers of IC chips and wafers.

4. Filler Disposition Film Manufacturing Method, and Filler Disposition Film According to the above-described anisotropic conductive film manufacturing method, a filler disposition film in which a filler is disposed in a plan view can be manufactured by using a filler similar to the conductive particles in place of the conductive particles.

That is, the filler disposition film manufacturing method according to the present embodiment includes: a holding step of supplying a filler of a plurality of particle diameters onto a member having a plurality of opening parts, and holding the filler in the opening parts; and a transfer step of transferring the filler held in the opening parts to an adhesive film; and in a particle diameter distribution graph (X-axis: particle diameter (μm), Y-axis: number of particles) of the filler held in the opening parts, the shape of the graph is such that the slope is substantially infinite in a range at or above a maximum peak particle diameter. In this manner, the cost for manufacturing a filler disposition film can be reduced by using a member having a plurality of opening parts, and classifying the filler. In addition, the present method is favorable even when the particle diameter distribution of the filler supplied to the opening parts is wide (even when broad). Therefore, an effect of being able to easily obtain balance between performance and cost can be expected including the use of a filler for which the lower limit side of the particle diameter has been classified, and a merit of an increase in usable options is obtained.

As the filler, an inorganic filler or an organic filler or both can be used according to the application of the filler disposition film. Examples of inorganic fillers include silica, calcium carbonate, talc, barium sulfate, aluminum hydroxide, aluminum oxide, magnesium hydroxide, magnesium oxide, titanium oxide, zinc oxide, iron oxide, and mica. In addition, examples of organic fillers include silicone resin, fluororesin, polybutadiene resin, and other known resin fillers and rubber particles.

For example, for a case in which the filler disposition film is used as a gap spacer, examples of the filler include silica, calcium carbonate, or a known resin filler, and rubber particles. Since the particle diameters of the filer are made uniform, the filler disposition film functions as an excellent gap spacer. Also, for example, for a case in which the filler disposition film is used as a light diffusing, matte imparting, gloss imparting, or other such optical member, examples of the filler include titanium oxide, zinc oxide, iron oxide or a known resin filler. Since the filler is disposed at a prescribed position in a plan view, the filler disposition film can exhibit excellent optical performance. Furthermore, for example, for a case in which the filler disposition film is used as a design member, examples of the filler include coloring fillers (including both inorganic and organic substances). Since the filler is disposed at a prescribed position in a plan view, the filler disposition film can exhibit excellent design properties.

The member having a plurality of opening parts, and the adhesive film are the same as those described above with respect to the method for manufacturing an anisotropic conductive film, and therefore descriptions thereof will be omitted here.

The filler disposition film according to the present embodiment includes: an insulating binder formed in a film shape; and a plurality of fillers disposed in a plan view on the insulating binder; and in a particle diameter distribution graph (X-axis: particle diameter ($\mu$m), Y-axis: number of particles) of the filler, the shape of the graph is such that the slope becomes substantially infinite in a range at or above a maximum peak particle diameter. In the filler particle diameter distribution, particles of large particle diameters are cut, and the filler is disposed in a plan view. Therefore, for example, in addition to known usage methods of conductive particles in anisotropic conductive films, the filler disposition film can be used in applications in which the film is used as a conductive member, and can also be used as a gap spacer, an optical member, a design member, and the like.

EXAMPLES

5. Examples

Examples of the present invention will be described hereinafter. In the present example, conductive particles that had been mixed at prescribed ratios (on a quantity basis) were supplied onto a resin mold on which an opening arrangement pattern had been formed, the conductive particles were held in the opening parts, and the conductive particles held in the opening parts were then transferred to an adhesive film to thereby produce anisotropic conductive films. Furthermore, the anisotropic conductive films were subjected to a classification evaluation. In addition, connection structures were fabricated using the anisotropic conductive films, and the connection structures were subjected to a conductivity evaluation, a capturing performance evaluation, and a short circuiting evaluation. Note that the present invention is not limited to these examples. For example, the same results as the results obtained in the classification evaluation of the anisotropic conductive film are obtained with the filler disposition film manufacturing method using resin particles in place of conductive particles and with the examples of the filler disposition film.

Production of Anisotropic Conductive Films
Fabrication of Resin Mold

A mold having convex portions arranged conforming to the above-described arrangement pattern was fabricated so that in a plan view of 3 $\mu$m conductive particles, an angle $\theta$ formed by the short-side direction of the anisotropic conductive film and a lattice axis in a square lattice arrangement was 15°, the distance between particles was equivalent to double the particle diameter of the conductive particles, and the number density of the conductive particles was 28000 particles/mm$^2$. Each convex portion of the mold was a square shape measuring 3.3 $\mu$m×3.3 $\mu$m, and the pitch at a center point thereof was 6 $\mu$m, which was double the average conductive particle diameter of 3 $\mu$m. In addition, the height of each convex portion (namely, the depth of the opening) was 3.5 $\mu$m. A resin mold on which the opening arrangement pattern was formed, was formed by melting known transparent resin pellets, pouring the melted pellets into the mold, and then cooling and hardening the resin. The depth of the opening parts of the obtained resin mold was the same as the height of the convex portions.

Production of Insulating Resin Layer A and Insulating Resin Layer B

A resin composition A of the following formulation was applied onto a PET film having a film thickness of 50 $\mu$m using a bar coater, and dried in an oven at 80° C. for 5 minutes, and thereby an insulating resin layer A having a thickness of 4 $\mu$m was formed on the PET film.

Resin Composition A (Insulating Resin Layer A)

Phenoxy resin (YP-50, from Nippon Steel & Sumikin Chemical Co., Ltd.): 30 parts by mass, epoxy resin (jER828, from Mitsubishi Chemical Corp.): 40 parts by mass, cationic curing agent (SI-60L, from Sanshin Chemical Industry Co., Ltd.): 2 parts by mass, filler (Aerosil RX300, from Nippon Aerosil Co., Ltd.): 30 parts by mass A resin composition B of the following formulation was applied onto a PET film having a film thickness of 50 $\mu$m using a bar coater, and dried in an oven at 80° C. for 5 minutes, and thereby an insulating resin layer B having a thickness of 14 $\mu$m was formed on the PET film.

Resin Composition B (Insulating Resin Layer B)

Phenoxy resin (YP-50, from Nippon Steel & Sumikin Chemical Co., Ltd.): 30 parts by mass, phenoxy resin (FX-316ATM55, from Nippon Steel & Sumikin Chemical Co., Ltd.): 30 parts by mass, epoxy resin (jER828, from Mitsubishi Chemical Corp.): 40 parts by mass, cationic curing agent (SI-60L, from Sanshin Chemical Industry Co., Ltd.): 2 parts by mass Production of Two-Layer Anisotropic Conductive Film As the conductive particles, 3 $\mu$m metal-coated resin particles (AUL703, from Sekisui Chemical Co., Ltd., average particle diameter of 3 $\mu$m, hereinafter described as "3 $\mu$m diameter particles") and 5 $\mu$m metal-coated resin particles (AUL705, from Sekisui Chemical Co., Ltd., average particle diameter of 5 µm, hereinafter described as "5 µm diameter particles") were prepared.

The conductive particles were weighed and inserted into a container so that the 3 µm diameter particles accounted for 80% and the 5 µm diameter particles accounted for 20% on a quantity basis, and the particles were thoroughly mixed to obtain the conductive particles A. To confirm the mixing, a small amount of the mixture was sampled and scattered in an adhesive film form, and then observed with a metallurgical microscope. Note that this was repeated three to ten times, and a homogeneous mixture state was confirmed.

Concavities of the resin mold on which the opening arrangement pattern was formed were filled with the conductive particles A, and the insulating resin layer A described above was placed thereon. This was subjected to pressing at 60° C. and 0.5 MPa, and the conductive particles A were thereby bonded to the insulating resin layer. The insulating resin layer A was then detached from the resin mold, and the conductive particles on the insulating resin layer A were compressed (pressing conditions: 60 to 70° C., 0.5 MPa) to thereby push the conductive particles A into the insulating resin layer A, and a layer containing conductive particles was produced. A layer made from the insulating resin layer B and not containing conductive particles was laminated at conditions of 60° C. and 0.5 MPa to the surface side at which the conductive particles A were present of the conductive particle-containing layer, and thereby, an anisotropic conductive film A having a thickness of 18 µm was produced.

Anisotropic conductive films B to E were produced in the same manner as described above with the exception of respectively using conductive particles B that were mixed so that 3 µm diameter particles accounted for 75% and 5 µm diameter particles accounted for 25% on a quantity basis, conductive particles C that were mixed so that 3 µm diameter particles accounted for 50% and 5 µm diameter particles accounted for 50% on a quantity basis, conductive particles D that were mixed so that 3 µm diameter particles accounted for 40% and 5 µm diameter particles accounted for 60% on a quantity basis, and conductive particles E for which 3 µm diameter particles accounted for 100% on a quantity basis.

Classification Evaluation of Anisotropic Conductive Films

Particle omissions in the arrangement were evaluated by observing the film surfaces of the conductive particle-containing layers of the anisotropic conductive films A to E using a metallurgical microscope. Observations of the anisotropic conductive films A to E were performed by observing a surface area of 50 µm in the film long-side direction and 200 µm in the film width direction at ten non-continuous locations. This was repeated at five locations, and a total surface area of 5 mm² was observed.

The results indicated that the anisotropic conductive films A to D exhibited more particle omissions in the arrangement as the quantity percentage of the 3 µm diameter particles of the conductive particles that were used decreased. However, as described below, the films A to D exhibited the same performance as the anisotropic conductive film E that used only 3 µm diameter particles, and thus the particle omissions were in a range that was not problematic for practical applications.

Furthermore, the particle diameter distribution of the conductive particle-containing layer of each of the anisotropic conductive films A to E was measured using a particle size distribution measuring instrument (FPIA-3000 (from Malvern)).

The results indicated that all of the particle diameter distributions of the conductive particles of the anisotropic conductive films A to E exhibited graph shapes with a slope that becomes substantially infinite at approximately 3 µm, and the maximum peak of each graph was smaller than 3 µm. That is, the graph shape in each case closely resembled a line parallel to the Y-axis at a particle diameter of approximately 3 µm. In addition, with respect to all of the anisotropic conductive films A to E, it was confirmed that 90% or more of all of the conductive particles were present in a range of ±30% of the average particle diameter. Note that due to the strict presence of conductive particles larger than 3 µm, the graph shape of a portion for which the Y-axis value is close to zero between the X-axis values from 3 µm to 3.3 µm (portion at which the Y-axis value is a slightly more positive value than Y=0 at X=3 to 3.3) took on a shape having only a slight shoulder as shown in FIG. 4.

Conductivity Evaluation of Connection Structure

Each of the anisotropic conductive films A to E was sandwiched between an IC for conductivity evaluation and a glass substrate, and heated and pressurized (180° C., 60 MPa, 5 seconds) to produce a connection structure for conductivity evaluation. Furthermore, the conduction resistance of each connection structure was measured initially after connection, and also after reliability testing in which the connection structures were left for 500 hours in a thermostatic chamber at a temperature of 85° C. and a humidity of 85% RH.

The results indicated that all of the connection structures obtained using the anisotropic conductive films A to E had an initial conduction resistance of less than 0.5Ω, and a conduction resistance after reliability testing of less than 5Ω. That is, the anisotropic conductive films A to D exhibited the same performance as the anisotropic conductive film E that used only 3 µm diameter particles, and thus it was clear that such films were not problematic for practical applications.

IC for conductivity evaluation:
External dimensions: 1.8×20.0 mm
Thickness: 0.5 mm
Bump specifications: size of 30×85 µm, distance between bumps of 50 µm, bump height of 15 µm
Glass substrate (ITO wiring):
Glass material: 1737F from Corning Inc.
Outer diameter: 30×50 mm
Thickness: 0.5 mm
Electrode: ITO wiring Capturing Performance Evaluation of Connection Structure The capturing state of the conductive particles was subjected to an indentation inspection using the connection structures that were used for the conductivity evaluation. From the results, it was confirmed that with all of the anisotropic conductive films A to E, at least three or more conductive particles per bump formed respectively independent indentations. In addition, regarding the captured quantity, the number of captured conductive particles tended to increase as the mixing ratio of the 3 µm diameter particles increased, and the anisotropic conductive film E that used only the 3 µm diameter particles exhibited the highest captured quantity.

Short Circuiting Evaluation of Connection Structure

The number of channels that were short circuited with respect to a quantity of 100 between bumps was measured for each of the connection structures that was used for the conductivity evaluation, and that number was used as the number of short circuits. The results indicated that none of the connection structures that were obtained using the anisotropic conductive films A to E exhibited short circuiting.

In addition, each of the anisotropic conductive films A to E was sandwiched between an IC for evaluating the short occurrence rate and a glass substrate of a pattern corresponding to the evaluation IC thereof, and heated and pressurized (180° C., 60 MPa, 5 seconds) to produce a connection structure for conductivity evaluation. Furthermore, the number of channels experiencing short circuiting between bumps was used as the number of short circuits, and the short occurrence rate was calculated by "(number of short circuits that occurred)/7.5 μm total space count".

The results indicated that all of the connection structures obtained using the anisotropic conductive films A to E had a short occurrence rate of less than 50 ppm. Note that when the short occurrence rate is less than 50 ppm, then the connection structure is suitable for practical use.

IC for Short Occurrence Rate Evaluation (Comb Tooth Test Element Group (TEG))
  External dimensions: 1.5×13 mm
  Thickness: 0.5 mm
  Bump specifications: Gold plated; height: 15 μm; size: 25×140 μm; distance between bumps 7.5 μm Comprehensive Evaluation In each of the classification evaluations of the anisotropic conductive films, and the conductivity evaluations, capturing performance evaluations, and short circuiting evaluations of the connection structures, the anisotropic conductive films A to D exhibited the same performance as that of the anisotropic conductive film E that used only 3 μm diameter particles, and thus it was clear that such films are not problematic for practical applications. That is, by applying the present invention, conductive particles having a broad particle diameter distribution can be used, and manufacturing costs can be reduced. In addition, from the results of the classification evaluation of the anisotropic conductive films, it was found that the same effects can be obtained even with a filler disposition film.

Note that in the above-described examples, conductive particles of large particle diameters were removed, but conductive particles of small particle diameters may be removed in advance using a known technique. Examples of methods for removing conductive particles of small particle diameters include a wet classification method in which vibration having an amplitude from 0.2 to 40 μm is applied to conductive particles in a liquid, and classification is performed through a sieve having a standard deviation of the short diameter of 10% or less.

REFERENCE SIGNS LIST

10: Member
20: Conductive particle
30: Adhesive film
40: Release film
50: First electronic component
51: First terminal row
60: Anisotropic conductive film
61: Conductive particle
70: Second electronic component
71: Second terminal row
80: Compression bonding tool

The invention claimed is:

1. A connection structure comprising:
    a first component, a second component, and a filler disposition film to which the first component and the second component are adhered; wherein
    the filler disposition film including: an insulating binder formed in a film shape; and a plurality of fillers disposed in a plan view on the insulating binder, wherein in a particle diameter distribution graph (X-axis: particle diameter (μm), Y-axis: number of particles) of the filler, the shape of the graph is such that the slope is substantially infinite in a range at or above a maximum peak particle diameter; and
    in a particle diameter distribution graph (X-axis: particle diameter (μm), Y-axis: number of particles) of the fillers included in the filler disposition film, the shape of the graph is such that a difference in a cumulative distribution between a particle diameter $D_{10}$ of a quantity accumulation of 10% from a small side of a particle diameter and a particle diameter $D_{90}$ of a quantity accumulation of 90% thereof is greater than 25% of an average particle diameter.

2. The connection structure according to claim 1, wherein the filler is a conductive particle, and the first electronic component and the second electronic component are anisotropically connected.

3. The connection structure according to claim 2, wherein the filler disposition film is cured.

4. The connection structure according to claim 2, wherein the conductive particle is covered by an insulator.

5. The connection structure according to claim 4, wherein the filler disposition film is cured.

6. The connection structure according to claim 1, wherein the filler disposition film is cured.

7. A method for manufacturing a connection structure, the method comprising:
    a disposing step of disposing a first electronic component and a second electronic component with a filler disposition film interposed the first electronic component and the second electronic component, the filler disposition film including: an insulating binder formed in a film shape, and a plurality of fillers disposed in a plan view on the insulating binder, wherein in a particle diameter distribution graph (X-axis: particle diameter (μm), Y-axis: number of particles) of the fillers, the shape of the graph is such that the slope is substantially infinite in a range at or above a maximum peak particle diameter; in a particle diameter distribution graph (X-axis: particle diameter (μm), Y-axis: number of particles) of the fillers included in the filler disposition film, the shape of the graph is such that a difference in a cumulative distribution between a particle diameter $D_{10}$ of a quantity accumulation of 10% from a small side of a particle diameter and a particle diameter $D_{90}$ of a quantity accumulation of 90% thereof is greater than 25% of an average particle diameter; and
    a compression bonding step of compression bonding the second electronic component to the first electronic component through a compression bonding tool.

8. The method for manufacturing a connection structure according to claim 7, wherein the filler is a conductive particle, and the first electronic component and the second electronic component are anisotropically connected.

9. The method for manufacturing a connection structure according to claim 8, wherein the insulating binder has curability.

10. The method for manufacturing a connection structure according to claim 8, wherein the conductive particle is covered by an insulator.

11. A filler disposition film comprising:
    an insulating binder formed in a film shape; and
    a plurality of fillers disposed in a plan view on the insulating binder, wherein in a particle diameter distribution graph (X-axis: particle diameter (μm), Y-axis: number of particles) of the filler, the shape of the graph is such that the slope is substantially infinite in a range at or above a maximum peak particle diameter; and in a particle diameter distribution graph (X-axis: particle diameter (μm), Y-axis: number of particles) of the fillers included in the filler disposition film, the shape of the graph is such that a difference in a cumulative distribution between a particle diameter $D_{10}$ of a quantity accumulation of 10% from a small side of a particle diameter and a particle diameter $D_{90}$ of a quantity accumulation of 90% thereof is greater than 25% of an average particle diameter.

12. The filler disposition film according to claim 11, wherein the filler is a conductive particle.

13. The filler disposition film according to claim 12, wherein the conductive particle is covered by an insulator.

14. The filler disposition film according to claim 12, wherein the insulating binder has curability.

15. The filler disposition film according to claim 11, wherein the insulating binder has curability.

16. A method for manufacturing the filler disposition film according to claim 11, the method comprising:

a holding step of supplying fillers having a plurality of particle diameters onto a member having a plurality of opening parts, and
holding the fillers in the opening parts; and
a transfer step of transferring the fillers held in the opening parts to an adhesive film, wherein
in a particle diameter distribution graph (X-axis: particle diameter (μm), Y-axis: number of particles) of the fillers held in the opening parts, the shape of the graph is such that the slope is substantially infinite in a range at or above a maximum peak particle diameter, and
in a particle diameter distribution graph (X-axis: particle diameter (μm), Y-axis: number of particles) of the fillers included in the adhesive film, the shape of the graph is such that a difference in a cumulative distribution between a particle diameter $D_{10}$ of a quantity accumulation of 10% from a small side of a particle diameter and a particle diameter $D_{90}$ of a quantity accumulation of 90% thereof is greater than 25% of an average particle diameter.

17. The method for manufacturing a filler disposition film according to claim 16, wherein the adhesive film has curability.

* * * * *